US010993574B2

(12) United States Patent
De'Longhi et al.

(10) Patent No.: US 10,993,574 B2
(45) Date of Patent: May 4, 2021

(54) COFFEE MACHINE WITH A MODULAR FRAME AND RELATIVE ASSEMBLY METHOD

(71) Applicant: De'Longhi Appliances S.R.L., Treviso (IT)

(72) Inventors: Giuseppe De'Longhi, Treviso (IT); Luciano Scian, Cordenons (IT); Massimo Poggioli, Carbonera (IT)

(73) Assignee: De'Longhi Appliances S.R.L., Treviso (IT)

( * ) Notice: Subject to any disclaimer, the term of this patent is extended or adjusted under 35 U.S.C. 154(b) by 266 days.

(21) Appl. No.: 16/300,141

(22) PCT Filed: May 10, 2017

(86) PCT No.: PCT/EP2017/061120
§ 371 (c)(1),
(2) Date: Nov. 9, 2018

(87) PCT Pub. No.: WO2017/194574
PCT Pub. Date: Nov. 16, 2017

(65) Prior Publication Data
US 2019/0142208 A1 May 16, 2019

(30) Foreign Application Priority Data
May 10, 2016 (IT) .................. 102016000047973

(51) Int. Cl.
*A47J 31/44* (2006.01)
*A47J 31/36* (2006.01)
(Continued)

(52) U.S. Cl.
CPC ............... *A47J 31/36* (2013.01); *A23F 5/26* (2013.01); *A47J 31/42* (2013.01); *A47J 31/4403* (2013.01);
(Continued)

(58) Field of Classification Search
CPC .... A47J 31/4403; A47J 31/44; A47J 31/4407; A47J 31/4482; A47J 31/42
(Continued)

(56) References Cited

U.S. PATENT DOCUMENTS 3,218,955 A * 11/1965 Lorang .................. A47J 31/00
99/282
4,757,753 A * 7/1988 Pandolfi .............. A47J 31/4403
99/290
(Continued)

FOREIGN PATENT DOCUMENTS

EP 0153549 A1 9/1985
EP 0761150 A1 3/1997
(Continued)

OTHER PUBLICATIONS

International Search Report dated Aug. 14, 2017; International Application No. PCT/EP2017/061120; International Filing Date: May 10, 2017; 6 pages.
(Continued)

*Primary Examiner* — Reginald Alexander
(74) *Attorney, Agent, or Firm* — Blank Rome LLP

(57) ABSTRACT

The coffee machine (1) comprises a modular frame comprising a primary module (2) and structurally independent secondary modules (3, 4) rigidly connected with the primary module (2), primary components assembled in the primary module (2), and an aesthetic casing (5) for covering the modular frame, the secondary modules (3, 4) comprising at least one base secondary module (3) and at least one lateral secondary module (4), respectively, cooperating with the primary module (2) to define the height and the overall width, respectively, of the coffee machine (1).

9 Claims, 10 Drawing Sheets

(51) Int. Cl.
*A47J 31/46* (2006.01)
*A23F 5/26* (2006.01)
*A47J 31/42* (2006.01)

(52) U.S. Cl.
CPC .......... *A47J 31/461* (2018.08); *A47J 31/465* (2013.01); *A47J 31/44* (2013.01); *A47J 2201/00* (2013.01)

(58) Field of Classification Search
USPC ........................................................ 99/284
See application file for complete search history.

(56) References Cited

U.S. PATENT DOCUMENTS

| | | | | |
|---|---|---|---|---|
| 4,892,031 A | * | 1/1990 | Webster | A47J 31/057 99/284 |
| 5,217,288 A | * | 6/1993 | Johnson | A47J 31/4403 312/257.1 |
| 5,957,033 A | * | 9/1999 | In-Albon | A47J 31/4403 99/284 |
| 2010/0218687 A1 | * | 9/2010 | Anliker | A47J 31/4403 99/289 R |
| 2014/0020564 A1 | * | 1/2014 | Reust | A47J 31/4403 99/291 |
| 2015/0182063 A1 | * | 7/2015 | Mills | A47J 31/46 99/283 |

FOREIGN PATENT DOCUMENTS

| | | |
|---|---|---|
| EP | 1864598 A1 | 12/2007 |
| EP | 2070454 A1 | 6/2009 |
| EP | 2208450 A1 | 7/2010 |
| WO | 2012032554 A1 | 3/2012 |
| WO | 2016055231 A1 | 4/2016 |

OTHER PUBLICATIONS

Written Opinion dated Aug. 14, 2017; International Application No. PCT/EP2017/061120; International Filing Date: May 10, 2017; 5 pages.
English translation of EP0761150; Publication Date: Mar. 12, 1997; 9 pages.

* cited by examiner

COFFEE MACHINE WITH A MODULAR FRAME AND RELATIVE ASSEMBLY METHOD

RELATED APPLICATIONS

This application is a U.S. national phase application of International Application No. PCT/EP2017/061120, filed May 10, 2017; which application claims priority to Italy Application No. 102016000047973, filed May 10, 2016. Each of the above-identified related applications are incorporated by reference.

FIELD OF USE

The present invention refers to a coffee machine and to the relative assembly method.

BACKGROUND OF THE INVENTION

At present, coffee machines are assembled on an assembly line starting from an internal frame in which all the components needed for its operation are installed.

Every type of coffee machine and model has its own dedicated frame.

It is thus necessary to have a large number of dedicated components in stock for every machine type and model.

This inevitably complicates logistics as concerns supplying and storing the components to be assembled, as well as the assembly line and process, and thus production costs.

Upon completion of the assembly process, a sample of each machine type and model must be tested and this too can contribute to prolonging the time to market, thus leading to a loss in productivity and competiveness.

SUMMARY OF THE INVENTION

The technical task of the present invention is therefore to realize a coffee machine and a relative assembly method that make it possible to eliminate the cited technical drawbacks of the prior art. Within the scope of this technical task, an aim of the invention is to realize a coffee machine having a construction that is particularly suitable for integrating additional functions.

Another aim of the invention is to realize a coffee machine having a construction that is particularly suitable for adaptation of its shape and size in height and width.

Another aim of the invention is to realize a coffee machine having a construction that is particularly suitable for adaptation of its aesthetic appearance.

Another aim of the invention is to realize a coffee machine having a construction that is particularly suitable for simplifying the assembly line.

A further aim of the invention is to realize a coffee machine having a construction that is particularly suitable for simplifying logistics as concerns supplying and storing the components. Realizing a coffee machine having a construction that is particularly suitable for reducing the time passing between assembly and actual placement on the market is another aim that is not least in importance.

The technical task, as well as the latter and other aims, according to the present invention, are achieved by realizing a coffee machine characterized in that it comprises an assemblable modular frame comprising a primary module and structurally independent secondary modules rigidly connected with the primary module, primary components assembled in the primary module, and an aesthetic casing for covering said modular frame, said secondary modules comprising at least one base secondary module and at least one lateral secondary module, respectively, both cooperating with the primary module to define the height and the overall width, respectively, of the coffee machine.

The coffee machine is preferably a hand-pump coffee machine.

Advantageously, the primary module has universal mechanical connection means for various types of base secondary modules, and universal mechanical connection means for various types of lateral secondary modules so that any type of secondary module can be coupled to the primary module.

The primary module with the primary components assembled therein thus constitutes a unit universally used for the construction of various types and models of manual coffee machines. In one embodiment of the invention, secondary components assembled in at least one of said secondary modules are provided to expand the functions of the manual coffee machine. In one embodiment of the invention, the primary module is predisposed with hydraulic connection means and/or electrical connection means for connecting at least one primary hydraulic component and/or one primary electrical component to at least one secondary hydraulic component and/or one secondary electrical component.

The number of secondary modules, the structure thereof and the secondary components assembled therein can vary according to the case at hand depending on the type and model of the manual coffee machine, it being understood that regardless of their specific features, the secondary modules all comprise an identical interface for mechanical connection to the primary module so that in each case the secondary module desired for the composition of the modular frame can be selected without any risk of incompatibility with the primary module.

In one embodiment of the invention, the secondary modules to be combined with the primary module have no secondary components and they are used solely for adapting the width and/or height of the machine.

In one embodiment of the invention, the mechanical properties of the secondary modules of the modular frame differ from each other and with respect to the primary module also based on the nature of the secondary components that they must support.

The present invention also discloses a method for assembling a coffee machine, characterised by providing structurally independent elements of an assemblable modular frame that comprise a primary module and secondary modules, assembling primary components in the primary module, fixing at least one lateral secondary module to said primary module so as to define the overall width of the coffee machine and at least one base secondary module so as to define the overall height of the coffee machine, and covering the modular frame thus assembled with an aesthetic casing.

The production process is simplified to a great extent in that it employs an initial unit that is universally valid for any type or model of coffee machine that needs to be realized.

Given that the various machine types and models all have a common core made up of the primary module and the primary components assembled therein, the testing and inspection procedures can also be standardized to a great degree and thus made more rapid.

Other characteristics of the present invention are also defined in the claims herein below.

BRIEF DESCRIPTION OF THE DRAWINGS

Further characteristics and advantages of the invention will become more apparent from the description of preferred, but not exclusive, embodiments of hand-pump coffee machines according to the invention, which are illustrated by way of approximate and non-limiting example in the attached drawings, of which.

DETAILED DESCRIPTION OF THE ILLUSTRATED EMBODIMENTS

Figure 1:
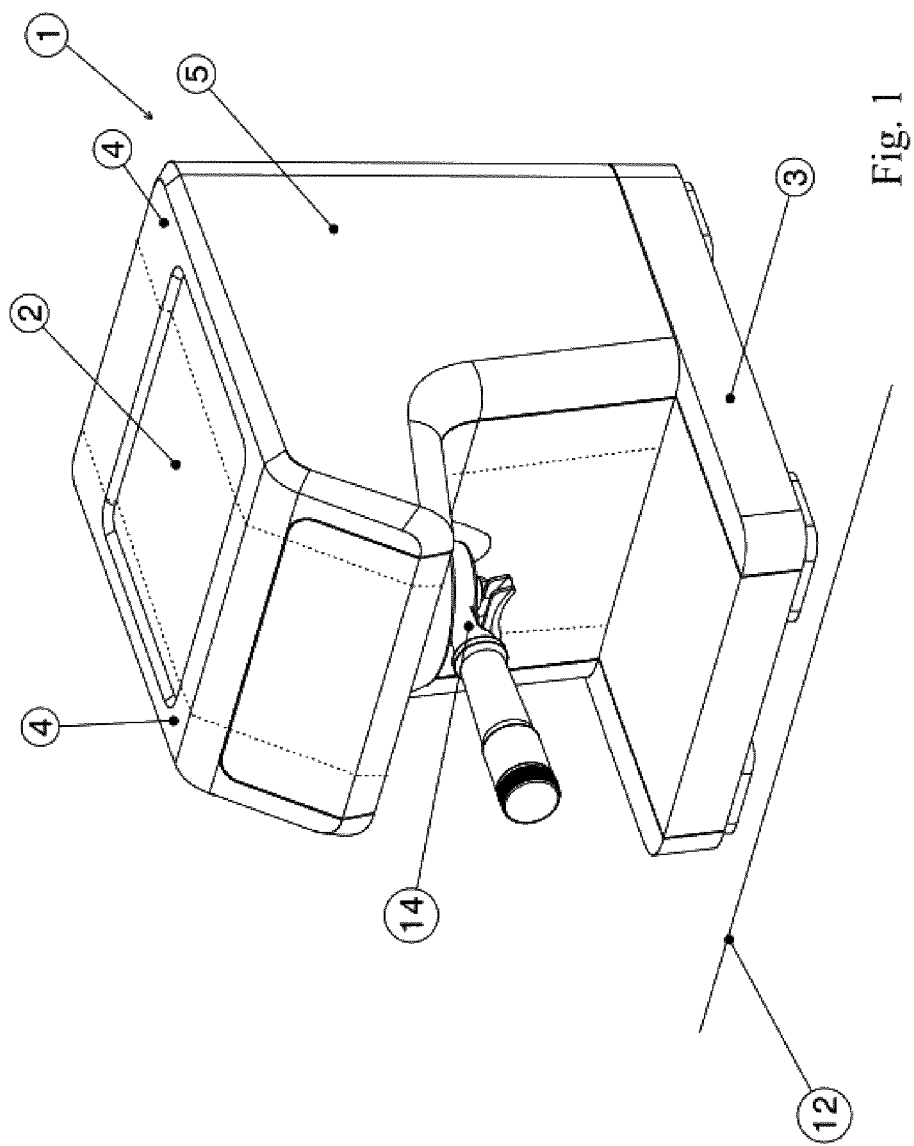
FIG. 1 shows an example of a hand-pump coffee machine in accordance with a first preferred embodiment of the invention.

Equivalent parts in the two illustrated embodiments of the invention are indicated by the same numerical references.

With reference to the figures cited, a manual coffee machine is shown and indicated in its entirety by reference number 1.

The machine 1 comprises a modular frame 2, 3, 4 and an aesthetic casing 54 for covering the modular frame.

The modular frame 2, 3, 4 comprises a primary module 2 and structurally independent secondary modules 3, 4 rigidly connected with the primary module 2.

The primary module 2 has universal mechanical connection means for the secondary modules 3, 4.

The mechanical connection means is of a universal type for all the secondary modules 3, 4 so that it can be selected for mechanical coupling any secondary module 3, 4 to the primary module 2 without compatibility problems.

These connection means can comprise for example snap-fastening systems, screw-fastening systems and other well-known connection systems.

The primary components needed for performance of the basic functions of the machine 1 are assembled in the primary module 2.

The secondary modules 3, 4 preferably comprise a base secondary module 3 positioned below the primary module 2, and two lateral secondary modules 4 positioned laterally to the primary module 2.

The base secondary module 3 cooperates with the primary module 2 so as to define the overall height of the coffee machine 1.

The primary module 2 is made up of shaped plates that delimit one or more housing compartments 8 for the primary components.

The lateral secondary modules 4 cooperate with the primary module 2 so as to define the overall width of the coffee machine 1.

The secondary modules 3, 4 are also preferably made up of shaped plates that can delimit one or more compartments 9.

Each lateral secondary module 4 has a vertical lateral face 10 coupled to a corresponding vertical lateral face 7 of the primary module 2.

The base secondary module 3 extends forward, rearward and laterally, from the perimeter of the lower face of the primary module 2.

In particular, the base secondary module 3 has a width equal to the width of the coffee machine 1 and a depth equal to the depth of the coffee machine 1.

More specifically, the base secondary module 3 has an upper horizontal face 11 coupled to a lower horizontal face 6 of the primary module 2 and to a lower horizontal face 30 of the lateral secondary modules 4, as well as a lower horizontal face 13 for resting the coffee machine 1 on the support surface 12.

The upper horizontal face 11 of the base secondary module 3 has specific abutments 31, 32 for proper positioning of the lower horizontal face 6 of the primary module 2, and the lower horizontal face 30 of the lateral secondary modules 4.

The secondary modules 3, 4 can be provided exclusively for adapting the dimensions of the coffee machine 1 with respect to the dimensions provided by the primary module 2, or they can also be provided to add functions to those provided by the primary module 2.

In the second case, secondary components are assembled in one or more of the secondary modules 3, 4.

The primary components installed in the primary module 2 comprise a filter holder cup 14, a boiler 15 for heating the coffee infusion water, a water tank 16, a pump 17 for supplying the coffee infusion water, valve means 18 for distributing water and/or steam and/or coffee, and on switch 19, an electronic control board 20, and preferably, but not necessarily, also a boiler for generating steam 21 and a flow meter 22.

In particular, the front of the primary module 2 has a bracket 23 that projects over the base secondary module 3 in a raised position. The bracket 23, in turn, has a hole in which a dispensing head 24 is assembled and with which the filter holder cup 14 is connected with hydraulic sealing. The dispensing head 24 dispenses hot infusion water into the filter holder cup 14 in a known manner for the production of coffee.

The rear of the primary module 2 has a structure 25 that rests on the base secondary module 3. An upper wall of the structure 25 has a connection seat 26 for the water tank 16, whereas a rear wall of the block 25 has the on/off switch 19 and a connector 17 for an electrical power cord of the coffee machine 1.

Figure 2:
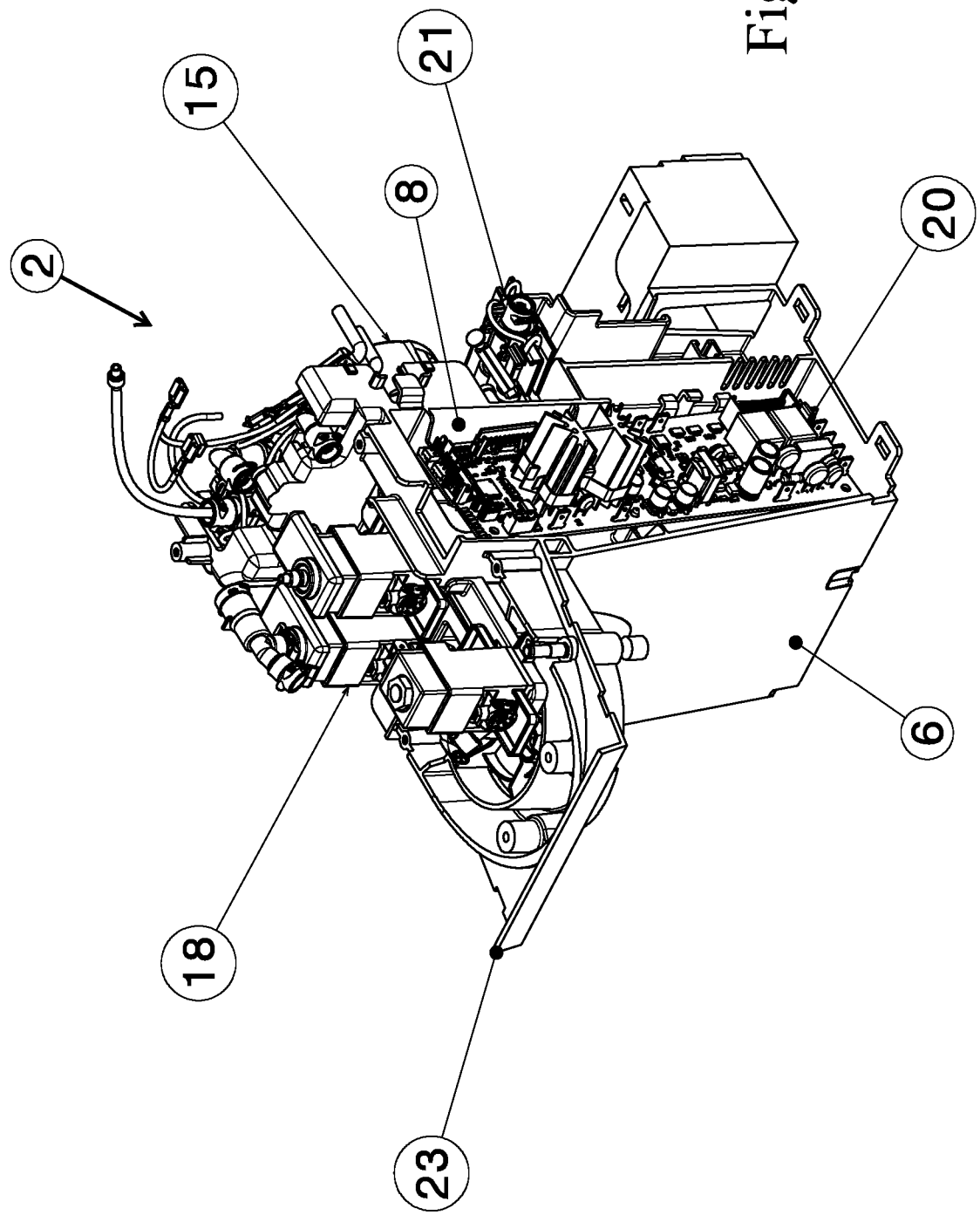
FIGS. 2 and 3 show the primary module of the frame of the machine of FIG. 1, from the right and left side.
Figure 3:
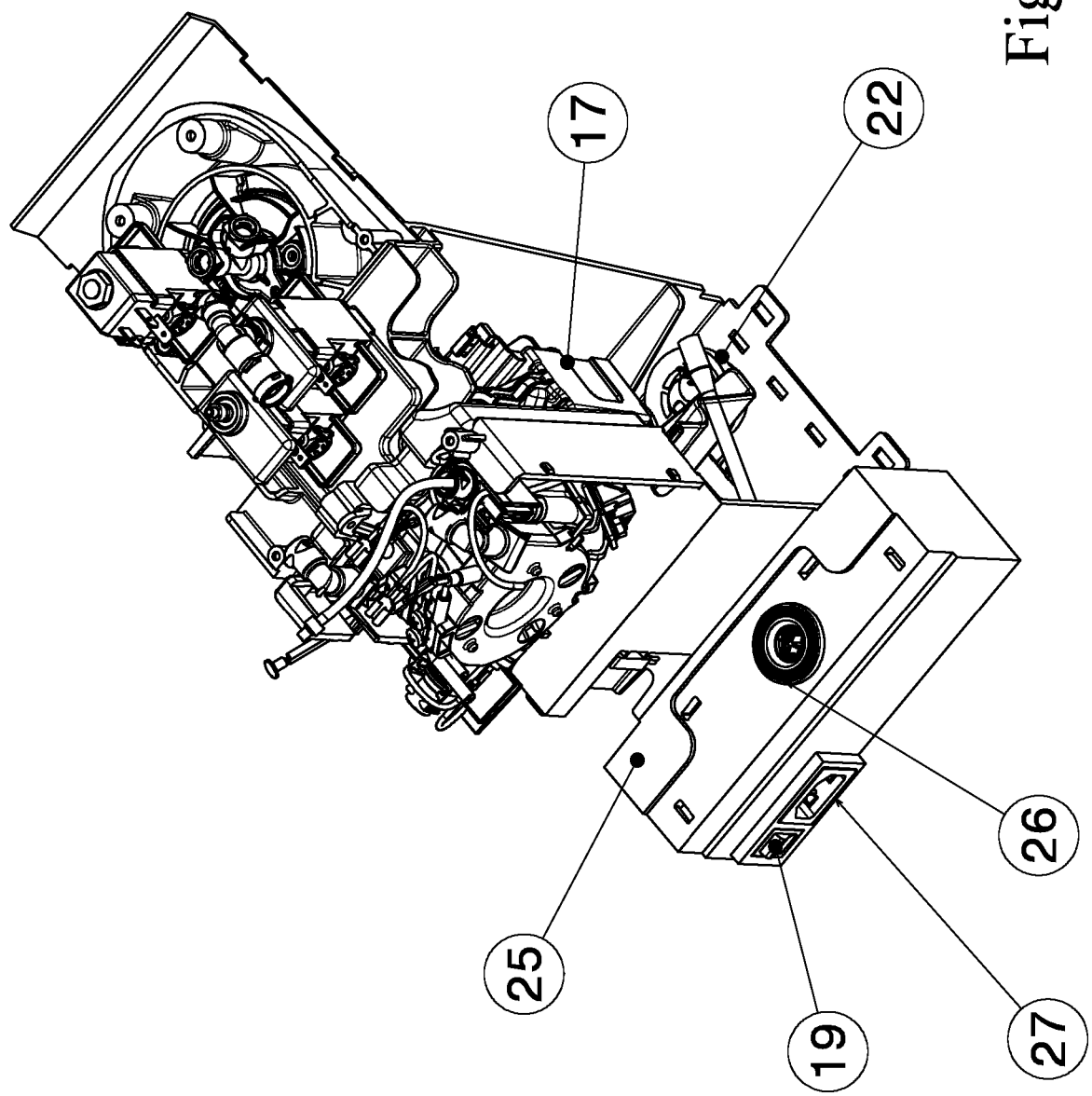
Figure 4:
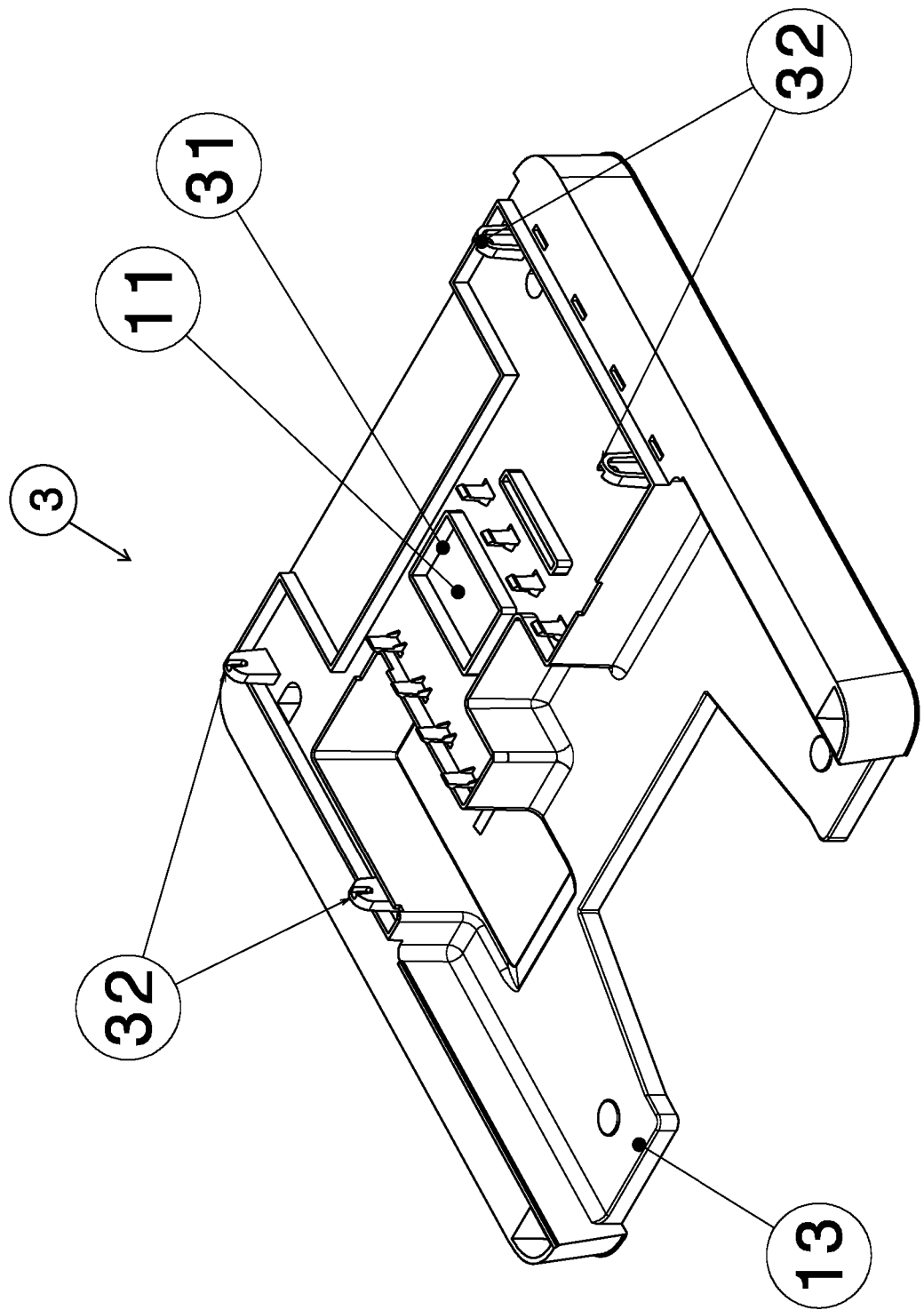
FIG. 4 shows the base secondary module of the frame of the machine appearing in FIG. 1.
Figure 5:
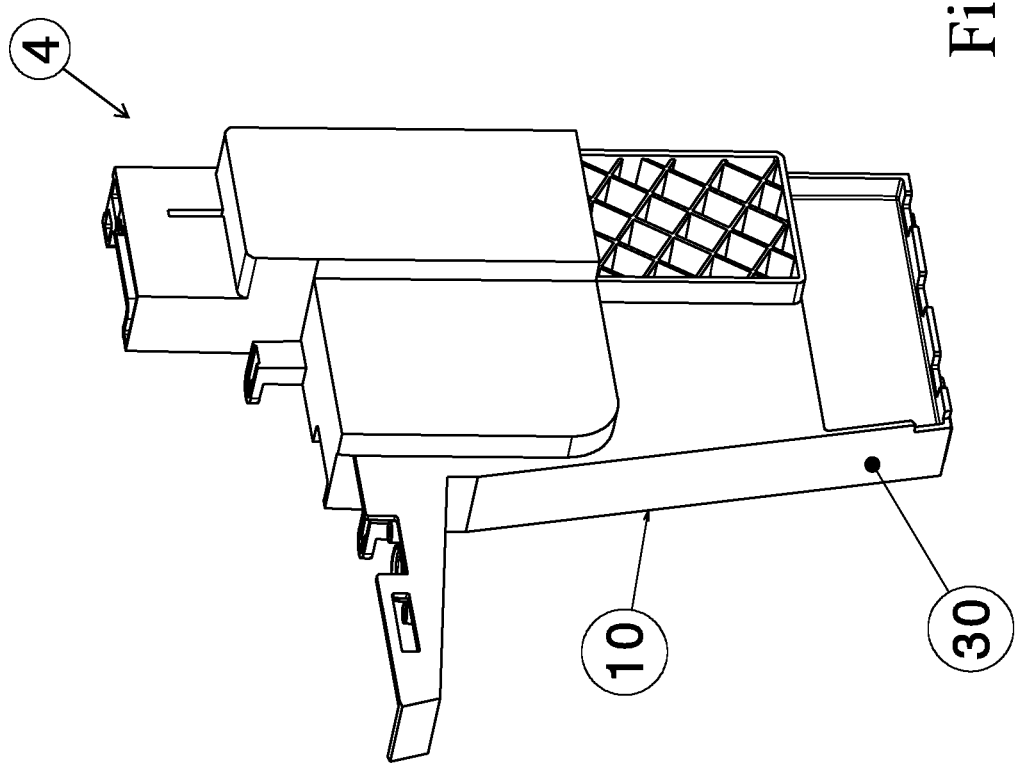
FIGS. 5 and 6 show the right and left lateral secondary modules of the frame of the machine appearing in FIG. 1.
Figure 6:
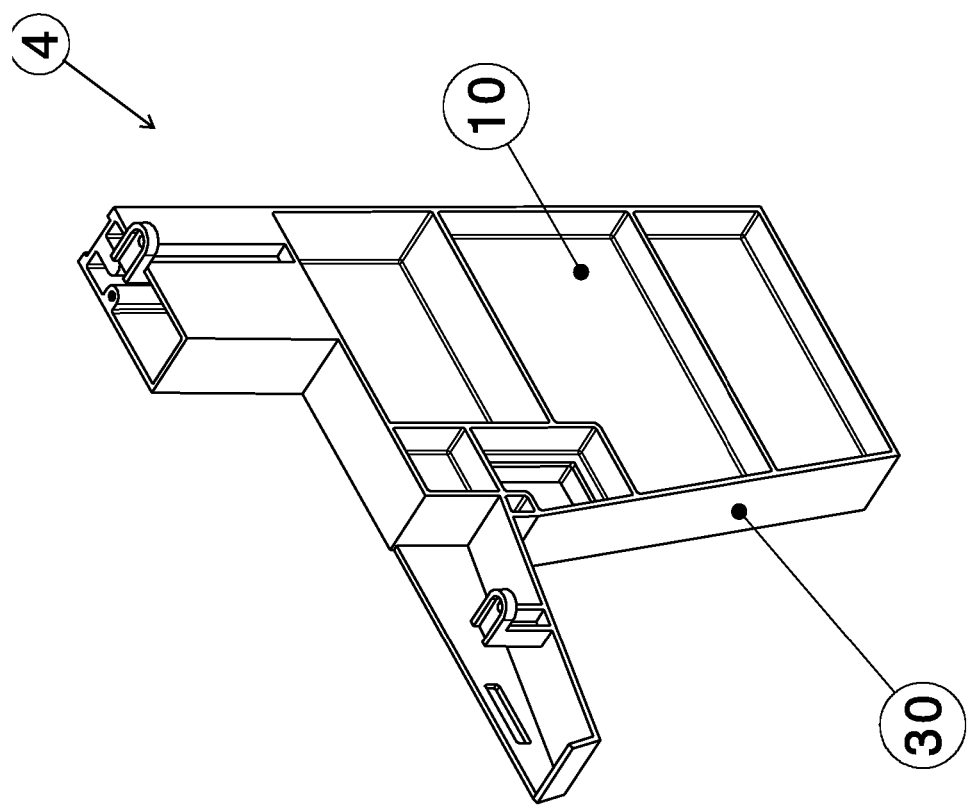

The other primary components are arranged in internal compartments of the primary module 2. With reference to the embodiment illustrated in FIGS. 1-6, the lateral secondary modules 4 contribute exclusively to the definition of the width dimension of the coffee machine 1, whereas the base secondary module 3 provides a support surface for the cups, in addition to contributing to the definition of the height dimension of the coffee machine 1.

Figure 7:
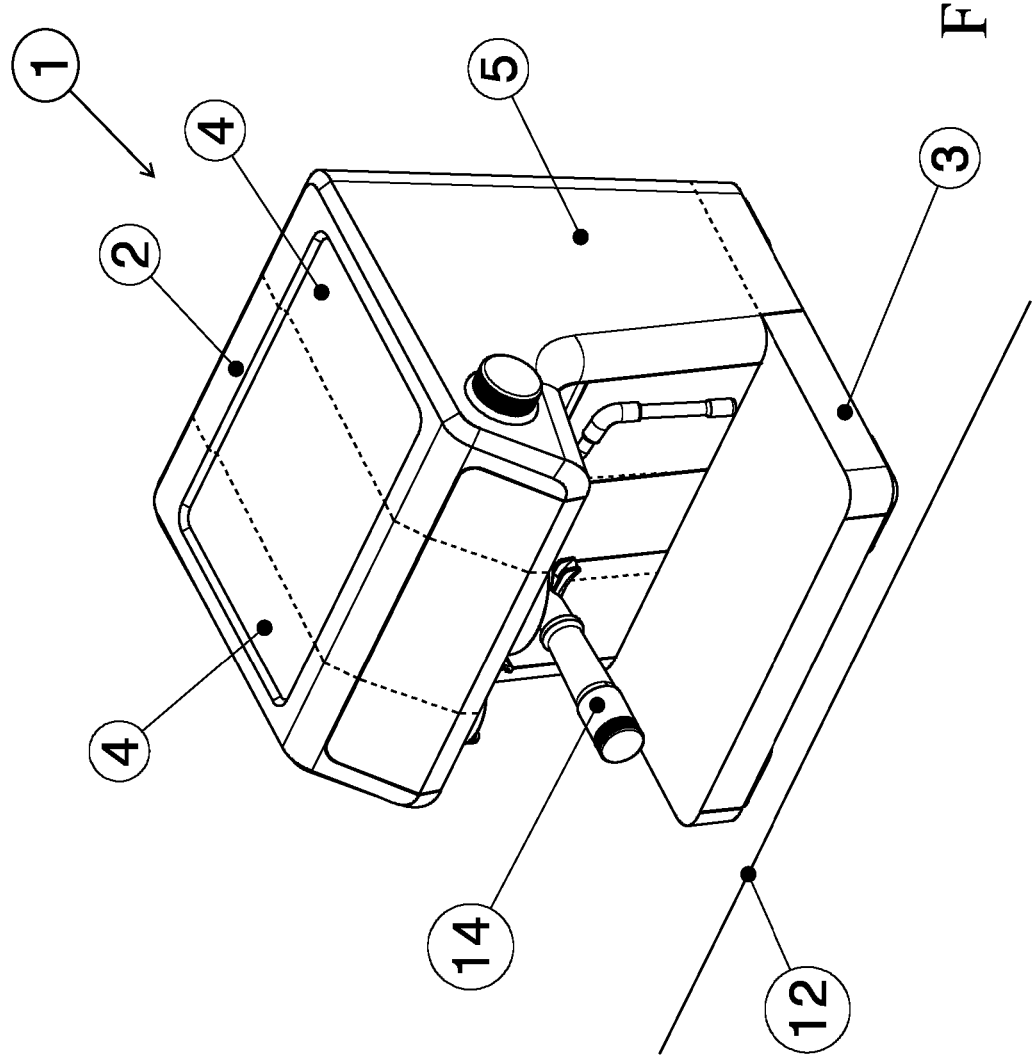
FIG. 7 is an example of a hand-pump coffee machine in accordance with a second preferred embodiment of the invention, and having additional functions with respect to the machine appearing in FIG. 1, said additional functions being implemented using the same primary module, with two lateral secondary modules and, respectively, a base module of dimensions differing from the dimensions used in the embodiment illustrated in FIG. 1.
Figure 8:
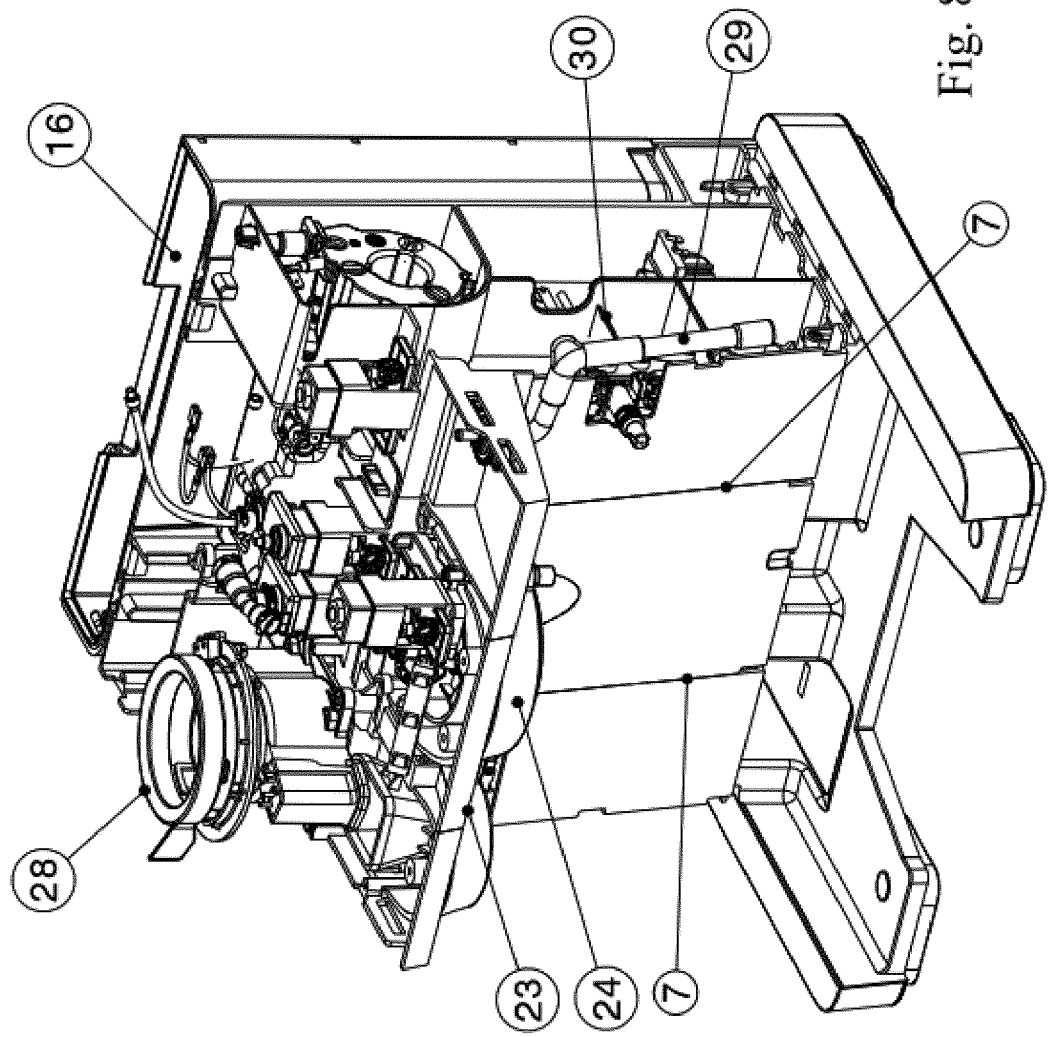
FIG. 8 shows the assembled modular frame of the machine appearing in FIG. 7.
Figure 9:
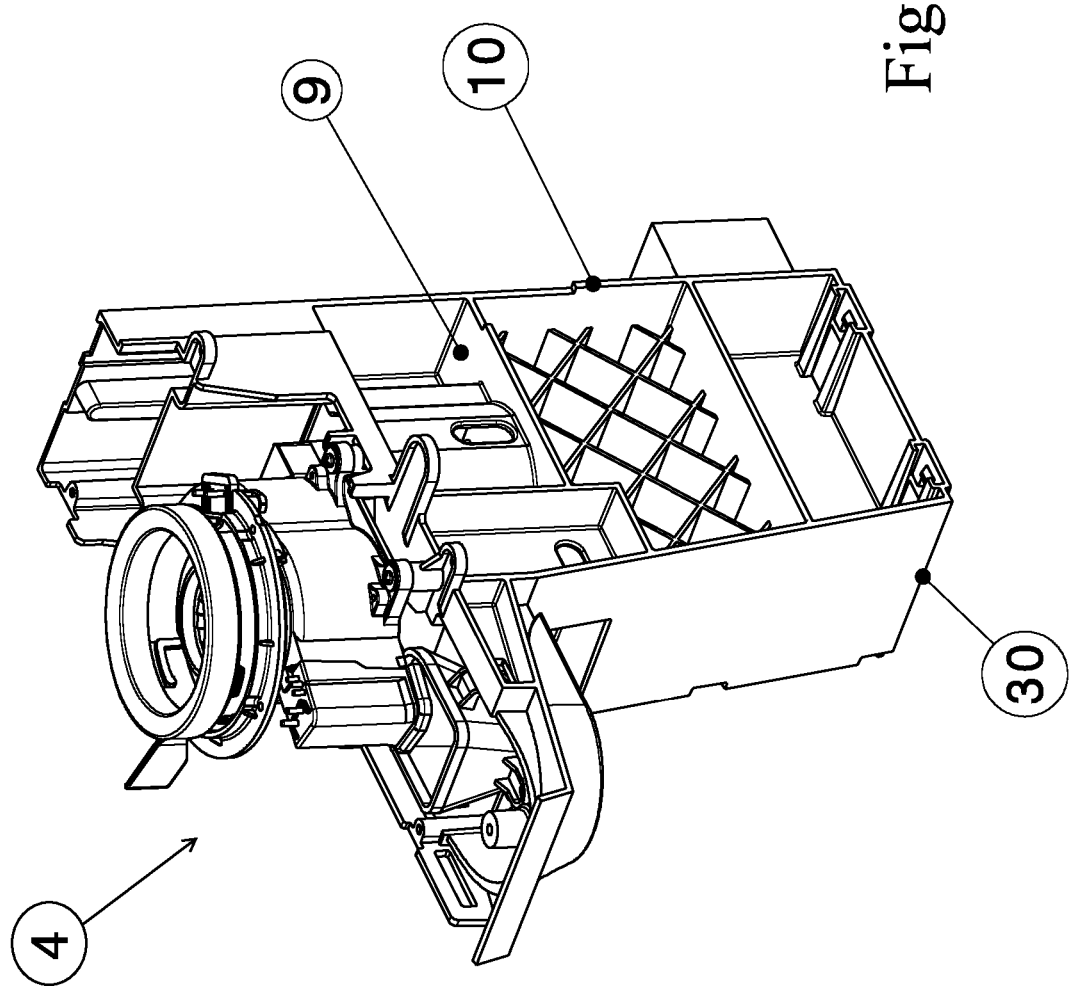
FIGS. 9 and 10 show the left and right lateral secondary modules of the coffee machine appearing in FIG. 7.
Figure 10:
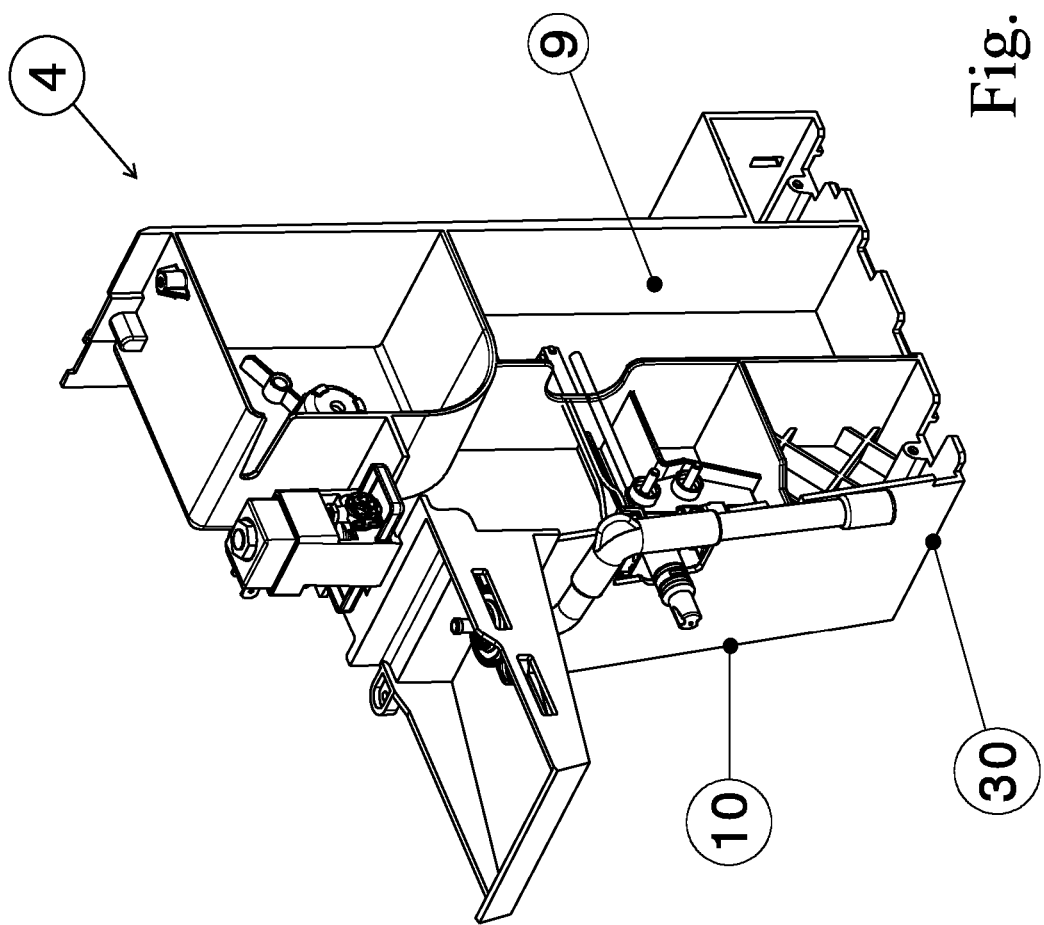

With reference to the embodiment illustrated in FIGS. 7-10, the lateral secondary modules 4 are wider and do not contribute exclusively to the definition of the width dimension of the coffee machine 1. In fact, the two lateral secondary modules 4 integrate various secondary components that add functions to those normally provided by the primary components. For example, the secondary components are made up of a grinder 28 for the coffee, a steam dispensing nozzle 29 and a milk emulsifying device (unillustrated) of a known type.

In this case, a specific electrical connection means (unillustrated) that electrically connects the grinder 28 and the electronic control board 20 is provided between the primary module 2 and the lateral secondary module 4 where the grinder 28 is installed. Furthermore, a specific hydraulic connection means (unillustrated) that hydraulically connects the steam dispensing nozzle 29 to the steam boiler 21 through the distribution valve means 18, is provided between the primary module 2 and the lateral secondary module 4 where the nozzle 29 is installed. Lastly, a specific connection means (unillustrated) that electrically connects the emulsifying device to the electronic control board 20 and hydraulically connects the emulsifying device to the steam boiler 21 through the distribution valve means 18, respectively, is provided between the primary module 2 and the lateral secondary module 4 where the emulsifying device is installed.

Preferably, the emulsifying device is removably installed on the lateral secondary module 4 which thus has an interface 30 for electrical and hydraulic connection with the emulsifying device.

The type and the number of secondary components that can be installed in the secondary modules 3, 4 depend on the prearranged configurations present in the primary module 2.

The primary module 2 is preferably already predisposed originally to support all possible functions.

For example, the boiler for steam and the mechanical, electrical and hydraulic interface for connection to the steam dispensing nozzle and/or to the milk emulsifying device are already installed in the primary module 2. When the lateral secondary modules 4 illustrated in FIGS. 7-10 are used instead of those illustrated in FIGS. 1-6, the functions that use steam can be activated.

In any case, the primary module 2 is a universal element that does not require retrofitting when there is a change in the type of coffee machine and/or model thereof.

The primary model 2 is thus the element common to all the coffee machines, regardless of the type and model.

Its operating capacity is autonomous according to minimum primary functions that are indispensable for preparing coffee.

Moreover, it also constitutes a basic version for a coffee machine of minimum dimensions. In this case, the casing 5 only covers the primary module 2.

Starting from this basic version, the only elements that change with a change in the type of coffee machine and the model thereof are the casing 5 and the secondary modules 3, 4 which can possibly increase the number of functions provided by the primary module 2, in addition to modifying the dimensions of the coffee machine.

There is thus a substantial common part of the production line for all types and models of coffee machines, resulting in an optimization of costs, simplification of logistics as concerns supplies and warehousing, an increase in productivity and a reduction of the time to market, given that the testing of the primary module 2 is valid for all types and models of coffee machines.

In addition to differing from each other in shape, dimensions and in the secondary components installed, the secondary modules 3, 4 can also differ in their mechanical properties.

For assembly of the coffee machine, once the primary modules have been assembled in the primary module 2, the possible secondary components are assembled in the secondary modules 3, 4, the secondary modules 3, 4 are assembled with the primary module 2 and the aesthetic casing 5 is applied to the modular frame thus assembled.

Thus conceived, the hand-pump coffee machine is susceptible to numerous modifications and variants, all of which falling within the scope of the inventive concept. Moreover, all details may be replaced with other technically equivalent elements.

The materials used, as well as the dimensions, may in practice be of any type, according to needs and the state of the art.

The invention claimed is:

1. A coffee machine (1) comprising: an assemblable modular frame comprising a primary module (2) and structurally independent secondary modules (3, 4) rigidly connected with the primary module (2), primary components for the operation of the coffee machine (1) assembled in the primary module (2), said primary components comprising a filter holder cup (14), at least one water tank (16), a pump (17) for supplying coffee infusion water, at least a boiler (15) for heating the coffee infusion water, an electronic control board (20), an on-switch (19), and distribution valve means (18) of water and/or steam and/or coffee, an aesthetic casing (5) for covering said assemblable modular frame, said secondary modules (3,4) comprising at least one base secondary module (3) and at least one lateral secondary module (4), respectively, cooperating with the primary module (2) to define the height and the overall width, respectively, of the coffee machine (1), and secondary components for the operation of the coffee machine (1) assembled in at least one of said secondary modules (3,4), said secondary components comprising a grinder (28) for the coffee.

2. The coffee machine (1) according to claim 1, characterized in that said primary module (2) has universal mechanical connection means for various types of base secondary modules (3).

3. The coffee machine (1) according to claim 1, characterized in that said primary module (2) has universal mechanical connection means for various types of lateral secondary modules (4).

4. The coffee machine (1) according to claim 1, characterized in that said primary module (2) is predisposed with hydraulic connection means of at least one primary hydraulic component and at least one secondary hydraulic component.

5. The coffee machine (1) according to claim 1, characterized in that said primary module (2) is predisposed with electrical connection means of at least one primary electrical component and at least one secondary electrical component.

6. The coffee machine (1) according to claim 1, characterized in that said primary components comprise at least one boiler (15) for heating the coffee infusion water and at least one boiler for generating steam (21).

7. The coffee machine (1) according to claim 1, characterized in that said primary components comprise at least one water tank (16).

8. The coffee machine (1) according to claim 1, characterized in that said secondary components comprise a milk emulsifying device.

9. An assembly method of a coffee machine (1), characterized by providing structurally independent elements of an assemblable modular frame comprising a primary module (2) and secondary modules (3,4), assembling primary components in the primary module (2), said primary components comprising a filter holder cup (14), at least one water tank (16), a pump (17) for supplying coffee infusion water, at least a boiler (15) for heating the coffee infusion water, an electronic control board (20), an on-switch (19), and distribution valve means (18) of water and/or steam and/or coffee, assembling secondary components for the operation of the coffee machine (1) in at least one of said secondary modules (3,4), said secondary components comprising a grinder (28) for the coffee, fixing to said primary module (2) at least one lateral secondary module (4) so as to define the overall width of the coffee machine and at least one base secondary module (3) so as to define the overall height of the coffee machine, and covering the modular frame thus assembled with an aesthetic casing (5).

\* \* \* \* \*